(12) United States Patent
Ohuchi et al.

(10) Patent No.: US 6,368,407 B2
(45) Date of Patent: Apr. 9, 2002

(54) SINGLE CRYSTAL-MANUFACTURING EQUIPMENT AND A METHOD FOR MANUFACTURING THE SAME

(75) Inventors: Ryuichi Ohuchi; Minoru Imaeda, both of Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/838,409

(22) Filed: Apr. 19, 2001

Related U.S. Application Data

(62) Division of application No. 09/280,148, filed on Mar. 26, 1999, now Pat. No. 6,241,820.

(30) Foreign Application Priority Data

Mar. 31, 1998 (JP) .............................. 10-086130
Mar. 16, 1999 (JP) .............................. 11-070269

(51) Int. Cl.[7] .............................................. C30B 35/00
(52) U.S. Cl. ......................... 117/200; 117/81; 117/83
(58) Field of Search ........................ 117/81, 83, 200, 117/900

(56) References Cited

U.S. PATENT DOCUMENTS

| | | |
|---|---|---|
| 3,796,552 A | 3/1974 | Robinson et al. |
| 4,863,553 A | 9/1989 | Lehoczky et al. |
| 4,968,491 A | 11/1990 | Nishizawa |
| 5,674,317 A | 10/1997 | Kimura et al. |

FOREIGN PATENT DOCUMENTS

| | | |
|---|---|---|
| JP | 7-206598 | 8/1995 |
| JP | 7-233000 | 9/1995 |
| JP | 8-40800 | 2/1996 |

OTHER PUBLICATIONS

Patent Abstracts of Japan, vol. 1997, No. 9, Sep. 30, 1997 (JP 09 124390 A).
Patent Abstracts of Japan, vol. 1996, No. 1, Jan. 31, 1996 (JP 07 233000 A & EP 0 686 711 A).
Patent Abstracts of Japan, vol. 1995, No. 11, Dec. 26, 1995 (JP 07 206598 A).
Patent Abstracts of Japan, vol. 1997, No. 10, Oct. 31, 1997 (JP 09169589 A).

*Primary Examiner*—Felisa Hiteshew
(74) *Attorney, Agent, or Firm*—Burr & Brown

(57) ABSTRACT

An equipment is disclosed for producing a single crystal in each of plural containers by thermally treating a raw material for the single crystal each charged in each of the container, including heaters provided corresponding to each of the containers, an elevator to move each of the containers upward and downward relatively to the respective one of the heaters, and a connecting member to connect at least one of the container and the heater of each of plural sets of the containers and the heaters mechanically to the elevator, wherein each container is moved vertically relatively to the respective one of the heaters by driving the elevator and passed through an area of thermal treatment formed by the heater to continuously form a melt in the raw material inside the container, and the single crystal is continuously produced in the container by solidifying the melt.

9 Claims, 7 Drawing Sheets

FIG_1

FIG_4

FIG. 5
(a)
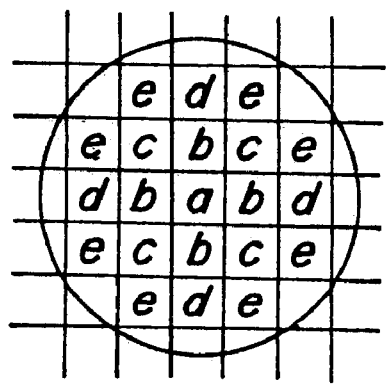
(b)
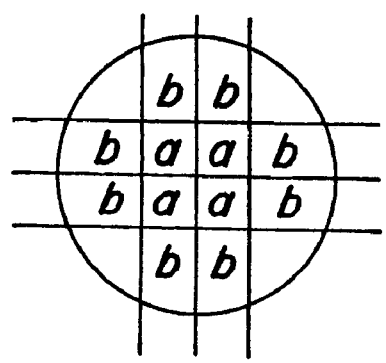

FIG_6

SINGLE CRYSTAL-MANUFACTURING EQUIPMENT AND A METHOD FOR MANUFACTURING THE SAME

CROSS REFERENCE TO RELATED APPLICATION

This is a divisional application of U.S. Ser. No. 09/280,148, filed Mar. 26, 1999, now U.S. Pat. No. 6,241,820, the entirety of which is incorporated herein by reference.

BACKGROUND OF THE INVENTION (1) Field of the Invention

This invention relates to equipment and a method for manufacturing a Hg—Cd—Mn—Te based single crystal.

(2) Related Art Statement

Recently, attention has been paid to an erbium doped fiber amplifier. The wavelength of 0.98 μm is particularly expected to be an exciting wavelength for erbium. The bulky Hg—Cd—Mn—Te based single crystal is much expected as a material for an optical isolator with a wavelength of 0.98 μm band. The range of a composition usable for an optical isolator is described in JP-A 7-233000, for example.

In the past, it has been difficult to grow a bulky Hg—Cd—Mn—Te based single crystal using the Bridgeman process without breaking the crucible because of the high vapor pressure of Hg, which invariably raises the internal pressure within a crucible to such an exent as to cause breakage of the crucible.

JP-A 7-206598 describes equipment using a high pressure Bridgeman furnace, by which a Hg—Cd—Mn—Te single crystal is formed. The equipment has a heater above a crucible over the high pressure Bridgeman furnace to prevent the precipitation of Hg with higher vapor pressure in the crucible. JP-A-8-40800 discloses a method for setting a material of single crystal in a container so that in THM method (traveling heater method), the production of a twin crystal may be prevented and the diameter of the thus obtained single crystal may be made large.

Although the mass production of single crystals with large diameters is known, along with the ability to prevent generation of a twin crystal, a difficult problem remains unsolved: Manufacturing a single crystal with a large diameter at a relatively low cost. This is because the vapor pressure of Hg increases in geometrical progression as its diameter becomes large, so that a high pressure Bridgeman furnace is used, and a container for forming the single crystal is required to be pressurized at about 30 kg/cm$^3$.

Compositional segregation is, however, recognized in the single crystal, as viewed in its diametrical direction, and sometimes crystals with different phases are generated since a melt has differing states between the outer peripheral part and the center part. Thus, since the characteristics of such a single crystal as an optical isolator largely vary, it is difficult to obtain one single crystal satisfying the characteristics required of an optical isolator. Moreover, the optical loss character of the isolator varies due to the deviation in the crystal orientation of the single crystal.

SUMMARY OF THE INVENTION

It is an object to improved and stabilize the characteristics of a single crystal.

It is a further object to enable the mass production of single crystals by prohibiting a compositional segregation, generation of different phases, deviation in the crystal orientation, etc., in the single crystal.

It is yet another object to provide manufacturing equipment for producing the single crystal.

This invention relates to equipment for producing a single crystal in each of a plurality containers of thermally treating a raw material for the single crystal in each of the containers, said equipment comprising heaters corresponding to each of the containers, an elevator to move each of the containers up or down relative to each of the respective heaters, and a connecting member to connect at least one of the container and the heater of each of the plurality of sets of containers and heaters mechanically to the elevator, wherein each container is moved vertically relative to each respective heaters by driving the elevator and passing it through an area of thermal treatment formed by the heater to continuously form a melt in the raw material inside the container, the single crystal being continuously produced in the container by solidifying the melt.

This invention also relates to a method for producing a single crystal in each of a plurality of containers by thermal treating of each container filled with sources of the single crystal, said method comprising thermal treating equipment corresponding to each container, an elevating drive to move each container up or down relative to each respective thermal treating equipment, and connecting members to connect at least one of the plurality of containers and the plurality of the thermal treating equipment mechanically to the elevating drive equipment, wherein each container is moved up or down relative to each respective thermal treating equipment by driving the elevating driving equipment and passing it through an area of thermal treatment formed by the thermal treating equipment to generate melting zones in the sources of the container in succession, and generating in each a single crystal container in succession by making the melting zones solid.

The present inventors have found that in the Hg—Cd—Mn—Te single crystal, for example, if the diameters of the single crystal and its container are increased, it is difficult to control microscopic compositional segregation, generation of different phase of crystals and deviation in the crystalline orientation are likely to occur. Based on the above finding, the inventors made further investigations. During their investigation, they tried to mass-produce single crystals by decreasing the diameters of the single crystal and the container to be filled with a starting material for the single crystal and increasing the number of the containers to be thermally treated.

Contrary to the expectations, in bundling a plurality of sealed members and setting them in a single THM furnace, it is very hard to control the characteristics of the single crystals in the many containers, thereby leaving the above-noted problems unsolved. That is, the condition of the each single crystal produced varies depending upon the respective containers. For example, in the case that a single crystal having good characteristics usable for an optical isolator is produced in one container, compositional segregation and different phase of crystals often occur in the single crystals in the other containers and the crystalline orientation is deviated among the single crystals. This means that it is very difficult to control a melt finely in each container in the case of treating many containers with their small diameters as well as in the case of the single crystals with large diameters. Moreover it is possible to bundle three to four sealing members at the maximum, but not possible to simultaneously grow single crystals for not less than five containers.

The inventors attempted to solve these fatally serious problems from the viewpoint of mass-production. During the studies, they have discovered that continuous production of the single crystals by providing heaters corresponding to respective containers, connecting each of the heaters mechanically to an elevator, vertically moving each of the heaters relative to the respective one of containers by driving the elevator, continuously producing a melt in the starting material for the single crystal by passing each container through an area for thermal treatment formed by the heater, thereafter solidifying the melt solves the above-noted problems.

Thus, they found that in each of the containers, the compositional segregation of the single crystals and the generation of different phases of crystals was prohibited and, also, that the fluctuations in the crystalline orientation in the single crystal were not observed. Accordingly, even in the single crystal for which it is difficult to control the melt such as a Hg—Cd—Mn—Te based single crystal, the present invention enables the mass production of single crystals beyond a certain level without causing compositional segregation, generation of different phase of crystals, or deviations in the crystalline direction.

The inventors further paid attention to the inner diameter of the container for growing the single crystal in developing equipment which enables the mass-production of the single crystal, and have also found that by setting the inner diameter of the container to 7 mm or less, the single crystal having a desired composition within a particular range can be mass-produced for the weight of the starting material. If the diameter is greater than 8 mm, the composition largely differs between an outer peripheral part and a central part of the single crystal, thereby giving a low yield during the growing step of the single crystal. However, by setting the inner diameter of that area of the container in which to grow the single crystal to 7 mm or less, the yield can be remarkably enhanced.

The reason for this is that the heat conduction from the heater is increased to stabilize the condition of the melt successively produced in the polycrystalline starting material and thus suppress different phase of crystals and the compositional segregation.

Preferably, the inner diameter of the container is 5 mm or less, and more preferably 3 mm or less. The lower limit of the inner diameter is only required to be larger than the dimension of the product to be manufactured.

BRIEF DESCRIPTION OF THE DRAWINGS

For a better understanding of the invention, reference is made to the attached drawings, wherein:

FIGS. 5(a) and (b) are plan views showing the cutting points in each sample when cutting out each sample shown in Tables 3, 4, 7, and 8 of a single crystal wafer in comparative example A and B, respectively;

DETAILED DESCRIPTION OF THE INVENTION

Specific embodiments of this invention will be also described in more detail hereinafter.

A polycrystalline starting material is preferred as a starting material for filling and being accommodated in, the container, but a starting material composed of a mixture of metal powders capable of producing a polycrystal may be used.

In a preferable embodiment, each heater has a tubular shape and a corresponding container is accommodated in the interior of the heater. Accordingly the fluctuation in the characteristics of the single crystal in its diametrical direction is prevented, because a thermally treating area defined inside the heater has a substantially uniform temperature distribution as viewed in the diametrical direction of the container. The wording "each heater has a tubular shape" includes the case in which a resistive heat-generating wire has a tubular shape and a plate-like form of a resistive heat-generating body is shaped in a cylindrical form.

In another preferred embodiment, the heater has a melt-producing part to form a melt, a preheating part around an upper side of the melt-producing part, and an annealing part around a lower side of the melt-producing part. Thus, by using such heaters, a successive process of pre-heating the starting material for the single crystal, producing the melt, producing the single crystal through solidifying the melt, and annealing the single crystal can be simultaneously effected under the same condition for all the containers. As a result, the fluctuations in crystallinity among the obtained single crystals are further suppressed.

In a further preferred embodiment, the container includes a crucible to be filled up with a starting material and a sealing member to accommodate and seal the crucible. In this case, the crucible preferably includes a single crystal-growing part vertically extending therefrom and an enlarged part at an upper side of the single crystal-growing portion.

Concrete embodiments of this invention are also described hereinafter, in reference to drawings.

Figure 1:
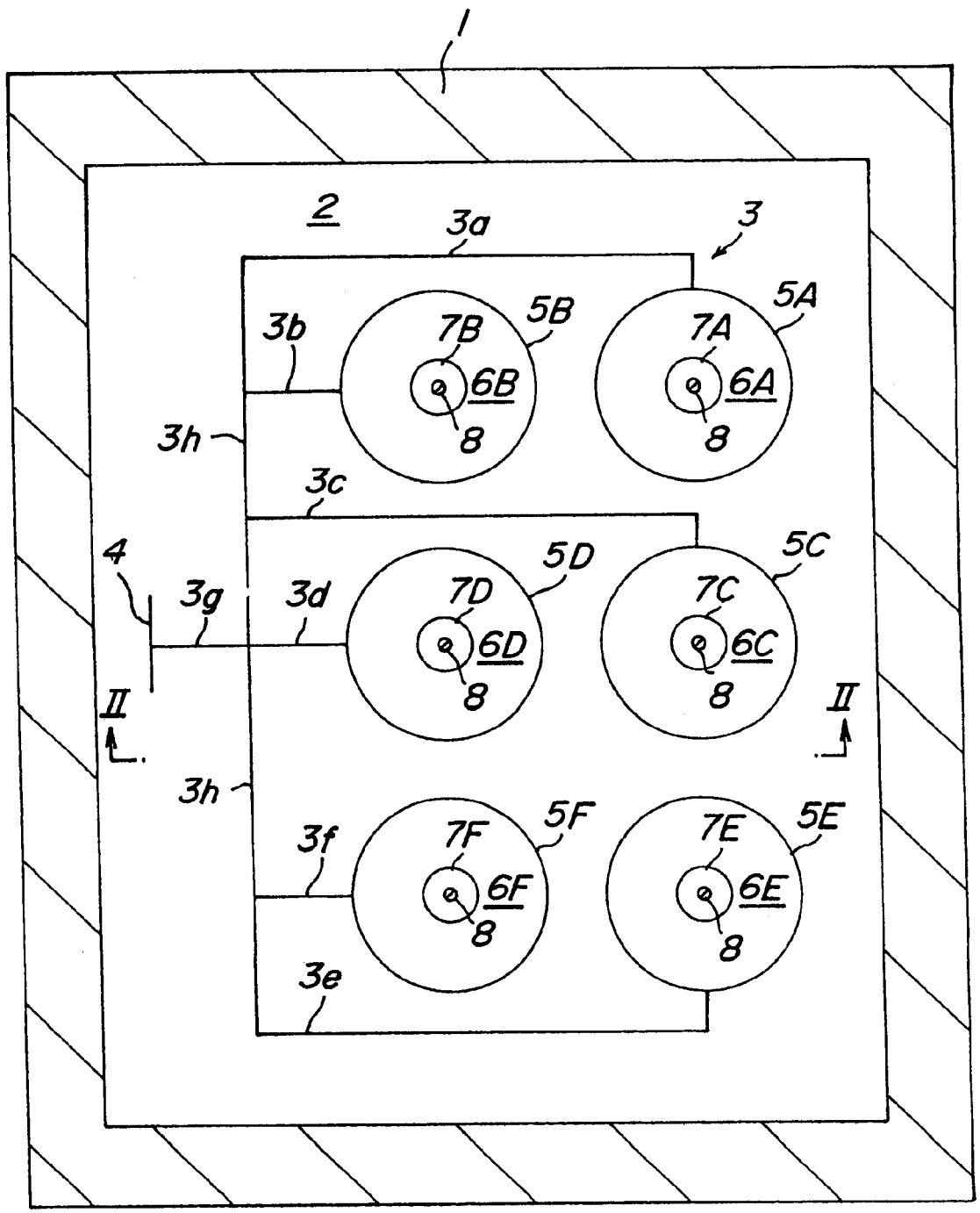
FIG. 1 is a plan view schematically showing a manufacturing equipment in an embodiment according to this invention.
Figure 2:
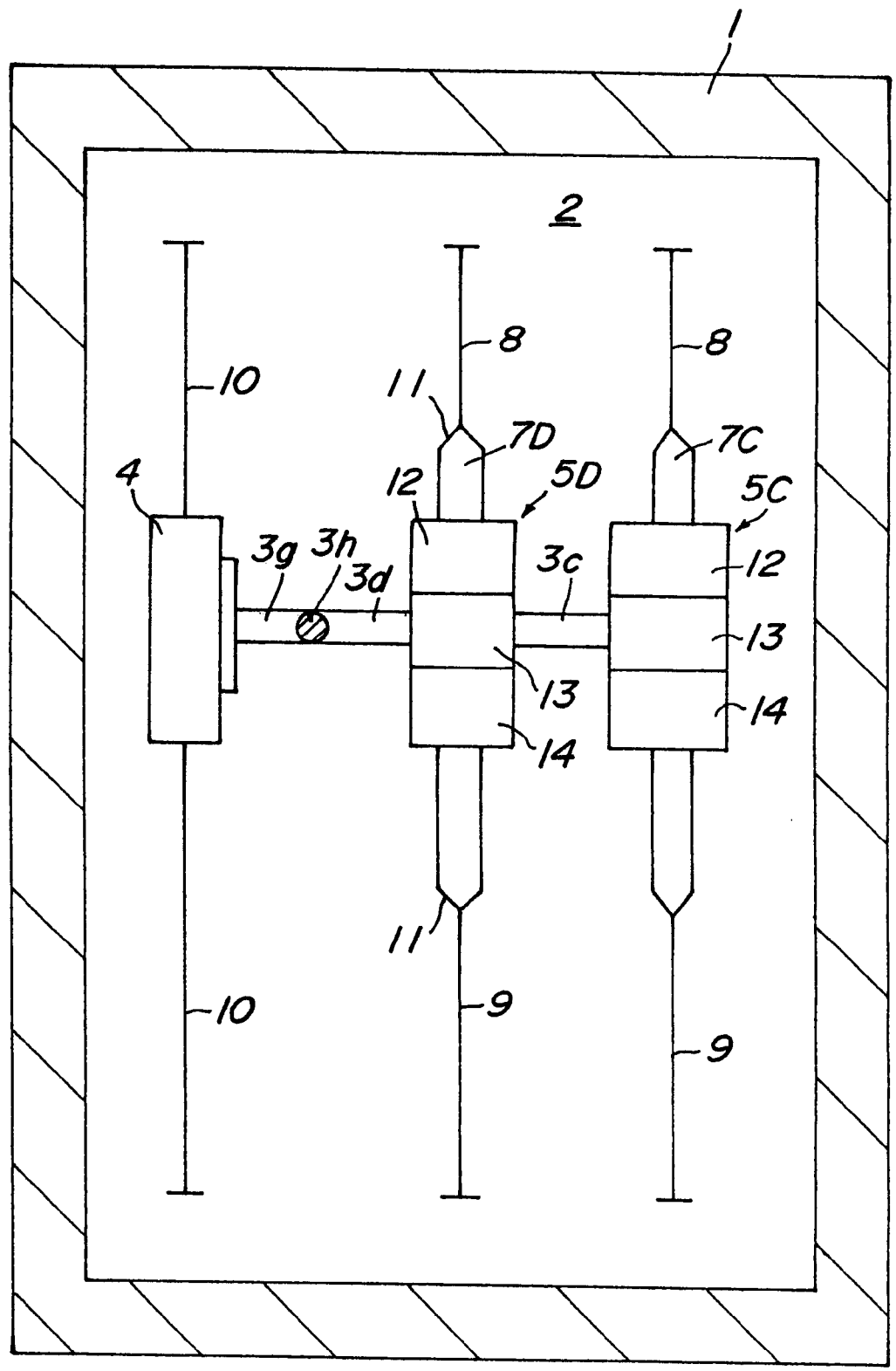
FIG. 2 is a front view of the embodiment of FIG. 1.
Figure 3:
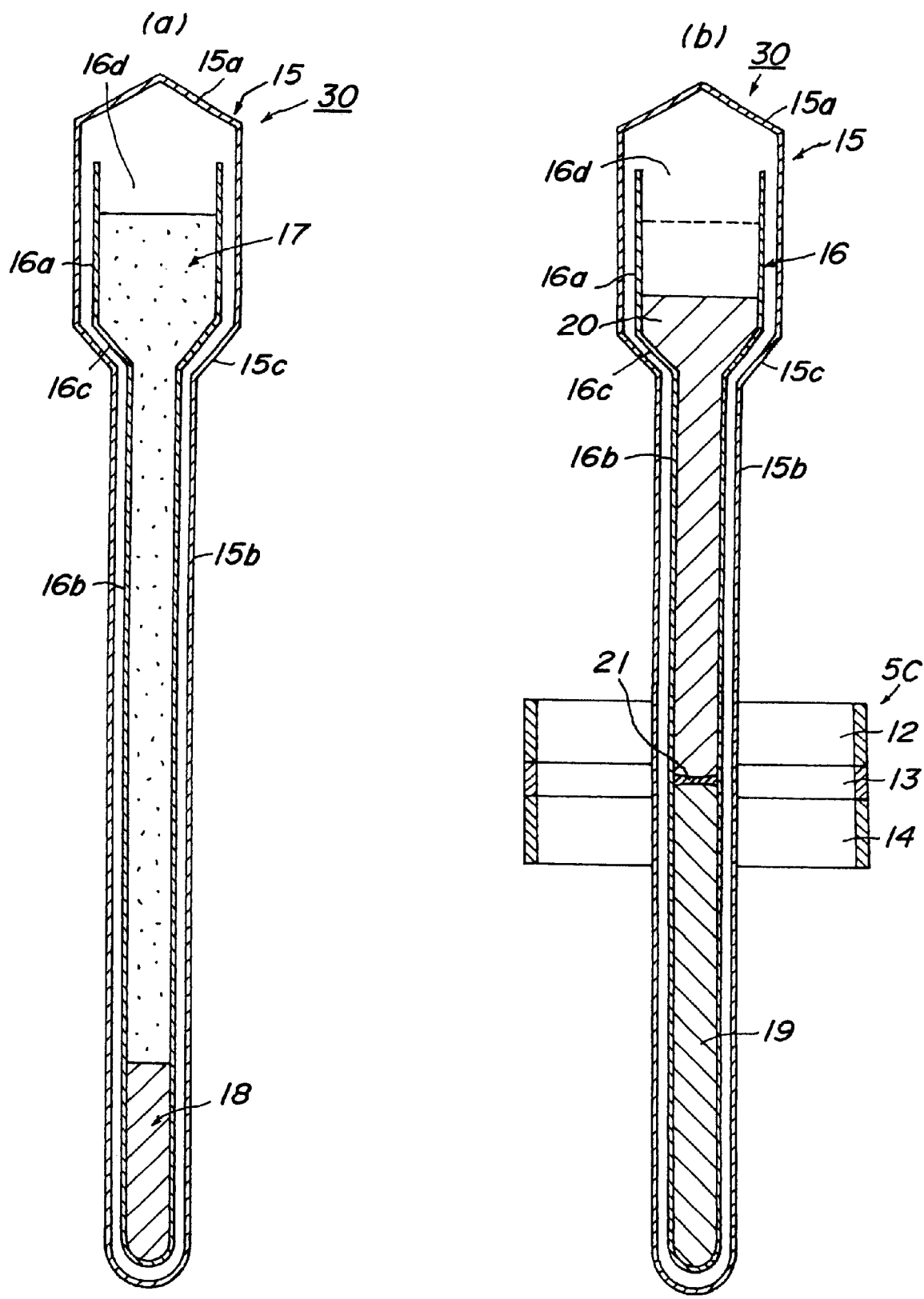
FIG. 3(a) is a cross sectional view schematically showing a crucible of a container used for this invention.
FIG. 3(b) is a cross sectional view schematically showing the polycrystalline starting material in the container of FIG. 3(a) being thermally treated.
Figure 4:
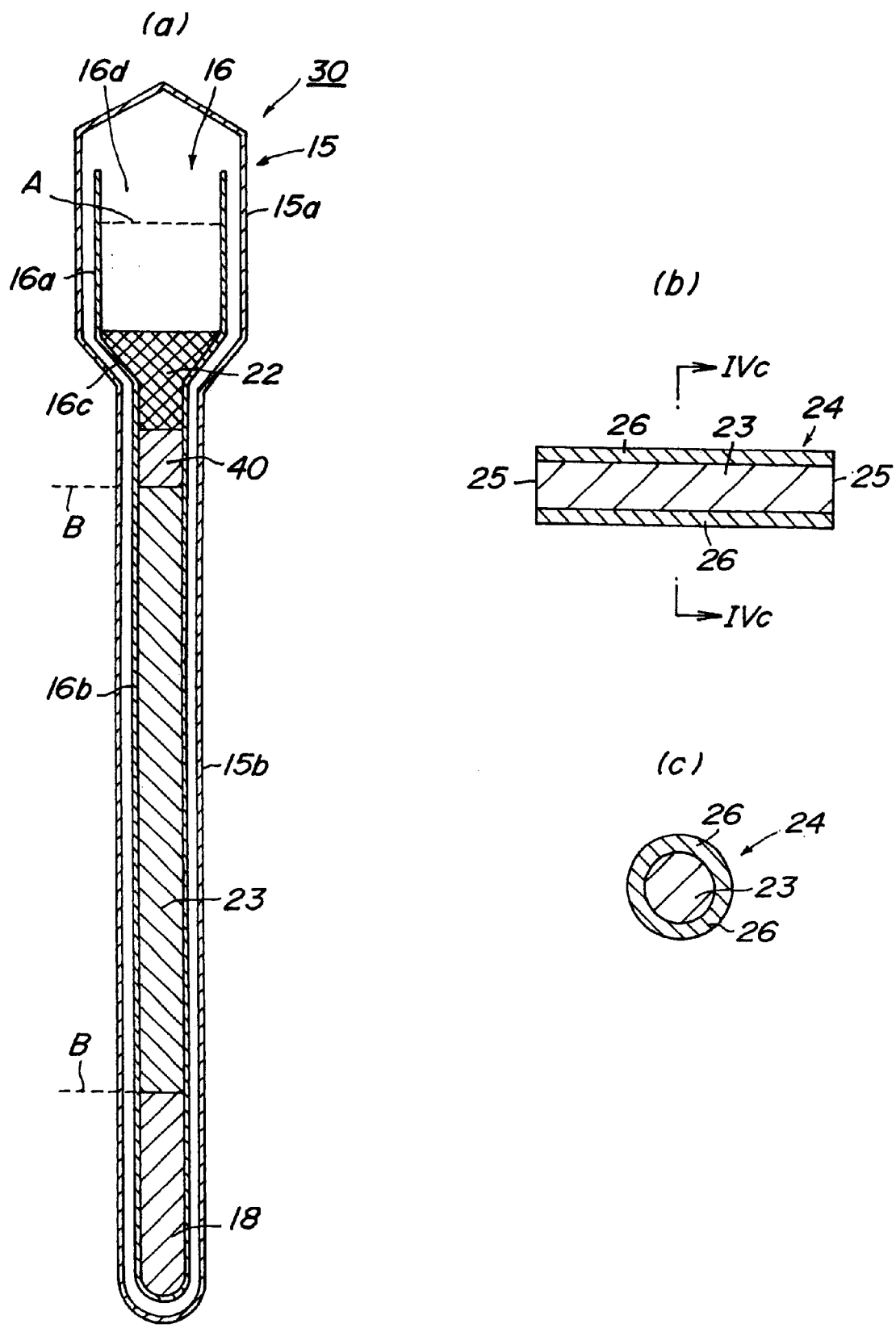
FIG. 4(a) is a cross sectional view schematically showing that a single crystal and a polycrystal are generated in a crucible 16.
FIG. 4(b) is a cross sectional view schematically showing a column like-body obtained by cutting off the tubular-part of a crucible.
FIG. 4(c) is a cross sectional view taken on line IVc—IVc of FIG. 4(b)

FIG. 1 is a plan view schematically showing a heater in an embodiment according to this invention, and FIG. 2 is a front view schematically showing the heater of FIG. 1. FIG. 3(a) is a cross sectional view schematically showing that a seed crystal and a starting material are provided in a crucible 16 of a container 30, and FIG. 3(b) is a cross sectional view schematically showing a state in which a melt is produced in the starting material inside the crucible. FIG. 4(a) is a cross sectional view schematically showing that a single crystal has been produced in the crucible.

The manufacturing equipment of this invention is accommodated in an inner space 2 of a refractory material 1. Each container 7A, 7B, 7C, 7D, 7E, 7F is filled up with a starting material for a single crystal. Each heater 5A, 5B, 5C, 5D, 5E, 5F is provided in a corresponding container. In this embodiment, the heaters are arranged in a matrix of 2×3, transversely and vertically, respectively, but the number and arrangement of the heaters may be changed.

An elevator 4 moves each heater up or down relative to the corresponding container. In this embodiment, the elevator is attached to around a spindle 10 and can be moved up or down along the spindle 10 with a driving mechanism (not shown).

A connecting member 3 is attached to the elevator 4. The connecting member 3 includes an attaching part 3g to the elevator 4 and attaching parts 3a, 3b, 3c, 3d, 3e, and 3f to the respective heaters 5A, 5B, 5C, 5D, 5E, and 5F. These attaching parts are connected to the attaching part 3g through a holding part 3h. Each container is fixed to a given portion with fixing spindles 8 and 9. Each heater can be moved up or down by driving the elevator 4.

Thermally treating areas 6A, 6B, 6C, 6D, 6E, and 6F are defined in the respective heaters. A single crystal is continuously produced in each container by passing the container through the thermally treating area, producing a melt in the starting material for the single crystal in the container, and solidifying the melt.

Each heater includes a preheating part 12, a melt-producing part 13, and an annealing part 14, as shown in FIG. 2. Thus, the melt is continuously produced in the starting material inside each container as the corresponding heater moves up.

It is desirable that the each container, such as container 30 of FIG. 3(a), includes a crucible 16 filled with a starting material 17 and a sealing member 15 to accommodate and seal the crucible 16. In this embodiment, the crucible 16 includes an enlarged part 16a, a tubular part 16b, and a connecting part 16c to connect the enlarged and tubular parts. The sealing member 15 also includes an enlarged part 15a, a tubular part 15b, and a connecting part 15c. The numeral reference 16d denotes an opening of the crucible 16.

As a material for the crucible, boron nitride, carbon, or amorphous glassy carbon is preferably used. Moreover a composite product consisting of any one of the above materials and a CVD or processing thin film of pyrolytic carbon(p-C), pyrolytic boron nitride(p-BN) or p-C and p-BN CVD processing bulk, crucible may be more preferably used, because of their decreased reactivity.

It is desirable that the enlarged part 16a and the tubular part 16b of the crucible are filled with starting material 17 composed of a mixed metal powders 17, and that the single crystal is produced at least in the cylindrical part 16b. For the crucible to actually grow the single crystal, the melt thereof is stably generated, and, thereby, the quality of the single crystal becomes stabler by making the diameter of the crucible as small as possible. As the diameter of the crucible is decreased, however, it is difficult to charge the starting material for the single crystal into the crucible. In this case, as the starting material is charged into the cylindrical part 16b through the enlarged part 16a, it is easy to fill the sources into the crucible.

Thereafter, the interior of the sealing member is normally vacuum-evacuated, and the crucible is sealed by cutting the member under vacuum sealing. The powdery starting material 17 is once melted, and a polycrystal is made by quenching the thus obtained melt. Then, when moving each heater upward, the polycrystalline starting material 20 in the tubular part 16b is heated successively from the under side to produce a melt 21 as shown in FIG. 3(b). The melt 21 moves upward gradually.

When producing the final single crystal 23, as shown in FIG. 4(a), it is formed in the tubular part 16b inside the crucible 16. Hereupon the single crystal having a desired composition is produced in an area between broken lines B. A part of the single crystal near the seed crystal is in a composition-changing zone according to material phase diagram, and a part of the single crystal above this zone is in a uniform zone with the desired composition. The seed crystal 18 exists under the lower broken line B. A single crystal 40 having the same composition as the melt is produced above the upper broken line B. A polycrystal 22 is normally produced in the connecting part 16c and the enlarged part 16a. The surface of the polycrystal 22 descends from the surface A of the powdery starting material 17.

By using the above crucible, pores hardly occur in the single crystal 23 when the melt is supplemented, and the convection of the melt actively occurs to further suppress compositional segregation.

Thereafter it is particularly desirable to use only the part of the single crystal 23 with the uniform composition in the tubular part 16b. For, in the step of producing the single crystal 23, a surplus metal component contained the powdery starting 17 or the polycrystal 20 tends to move upward in the crucible 16, that is, into the enlarged part 16a, so that the surplus metal is localized in the polycrystal 40 of FIG. 4(a). Thus, by abandoning the polycrystal formed in the enlarged part 16a and utilizing the single crystal 23 generated in the tubular part 16b, the characteristics of the single crystal, particularly, the optical characteristics thereof are more stabilized.

It is preferable that the seed crystal 18 is accommodated in the lowest part of the crucible 16 and the powdery starting material 17 is charged onto the seed crystal 18. Thereby the crystalline orientation of each 23 produced in the container 30 is more uniform.

At least a part of the tubular part 16b of the crucible 16 can be cut out of the crucible 16. For example, along the broken lines B shown in FIG. 4(a), the tubular part 16b and the single crystal 23 are cut out. Thereby, for example, as shown in FIGS. 4(b) and(c), a column-like body 24 consisting of tubular covering part 26 and the single crystal 23 can be obtained and used as an optical material. In that case, light can pass through between a pair of ends 25 of the single crystal 23.

In this invention, as the diameter of the container in the area to produce the single crystal is decreased, the weight of the starting material 17 filled in the interior of each container 30 is relatively decreased, also. Accordingly, the thermal treatment of the container 30 can be carried out under non-pressurizing condition.

In the boundary area between the melt-producing part 13 and the annealing part 14, a temperature gradient occurs. This temperature gradient is preferably 50° C./cm or more, thereby increasing the velocity of the crystallization, to an extent that different phases of crystal are unlikely to remain. Moreover, the temperature gradient is more preferably 100° C./cm or less, thereby preventing pores from occurring.

The vertical length of the melt-producing part is preferably 5 mm or more, by which the melt is stably produced with high reproductivity. Moreover, that vertical length is preferably 30 mm or less. For, in the case of a too long melting part, an area giving a desired composition for the single crystal is decreased due to slow changing in the composition.

The vertical length of each of the preheating part and the annealing part is preferably 30 mm or more, which suppresses occurrence of pores and increases the crystallization speed. The vertical length each of the preheating part and the annealing part is preferably 100 mm or less.

The manufacturing method and equipment in this invention can be applied to single crystals having various compositions, for example, II–VI Group compound-based single crystals such as Hg—Mn—Te, Hg—Cd—Te, Cd—Mn—Te, Hg—Cd—Mn—Zn—Te, Hg—Cd—Mn—Te—Se and Zn—Be—Mg—Se—Te, and III–V Group compound-based single crystals such as Ga—Al—As—P and In—Al—As—P.

In particular, in the case of forming a single crystal having an Hg—Cd—Mn—Te composition, a mixture of an Hg—Te alloy and a Cd—Te alloy is used as a powdery starting material of the single crystal. Thereby the generation of heat near the reaction of their powdery starting material and the damage of the sealing due to such heat generation can be prohibited.

In the case of forming a single crystal having a Hg—Cd—Mn—Te composition, the temperature in the melt-producing part to grow the single crystal is preferably not less than 700° C. to not more than 1050° C. Moreover, in this case the temperature of the preheating part is preferably set lower than that of the melt-producing part by not less than 50° C. to not less than 300° C., so that the growth of the polycrystal can be controlled, and the leaving of Hg and Cd from the polycrystal, which may cause compositional segregation, can be prohibited. Moreover, the temperature of the annealing part is preferably not less than 400° C. to not more than 1000° C.

Furthermore, in the case of forming a single crystal having an Hg—Cd—Mn—Te composition, the composition of the single crystal is preferably within the composition range defined by connecting points of $(Hg_{0.5}Cd_{0.0}Mn_{0.5})Te$, $(Hg_{0.08}Cd_{0.8}Mn_{0.12})Te$, $(Hg_{0.05}Cd_{0.5}Mn_{0.45})Te$, and $(Hg_{0.5}Cd_{0.5}Mn_{0.0})Te$ by straight line segments.

Each container and the corresponding sealing member are preferably fixed to extend in parallel to each other, and both the upper end and the lower end of each container are preferably fixed. By so doing, vibration of the melt is inhibited to control the formation of different phase of crystals.

Moreover, in FIG. 2 by way of example, each container is preferably fixed at three or four points at a joint portion 11 between each of fixing spindles 8 and 9 and each container by using ball-point screws to sustain the horizontal level or the circularity. Thereby the fluctuations of the melt is diminished to prohibit the occurrence of deviations in the crystalline orientation.

More concrete experimental results will be described hereinafter.

EXAMPLE A

An optical material made of a single crystal having an Hg—Cd—Mn—Te composition was grown according to the above method as explained referring to FIG. 1 to FIG. 4. Concretely, as a powdery starting material 17, Cd, Mn, an Hg—Te alloy, and a Cd—Te alloy were employed. A crystal having a (111) orientation of CdTe (diameter: 3 mm, length: 30 mm) was used as a seed crystal. 300 g of the starting material was formulated to give a composition of $(Hg_{0.16}Cd_{0.68}Mn_{0.16})Te$ after the formulation. The sealing member 15 was formed of quartz glass in a thickness of 2 mm. The inner diameter and the length of the tubular part 16b of the crucible 16 were 3 mm and 300 mm, respectively. The inner diameter and the length of the enlarged part 16a of the crucible 16 were 5 mm and 50 mm, respectively. The crucible 16 was formed of p-BN bulk in a thickness of 1 mm. The seed crystal was put into the container, and 15 g of the powdery starting material was charged into the crucible 16. The, crucible was put into the sealing quartz member, and the sealing member was sealed.

Containers 30 were formed by using 20 sealing members, and accommodated in a normal pressure electric furnace, which was heated to 1100° C. at 50° C./hour to melt the starting material 17. At that time, the system was designed such that the seed crystal 18 was prevented from melting through cooling with a cooling mechanism (not shown). As the temperature went up, the starting material put into the container turned to a melt, and the melt was formed at a location up to a level of a tapered part 16c of the crucible. Next, the container was cooled rapidly to obtain a polycrystalline starting material 20. Thereafter each container 30 was taken out and set into a manufacturing equipment of FIGS. 1 and 2.

Hereupon the inner diameter and the length of the melt-producing part in each heater were 15 mm and 10 mm, respectively. The length of each of the preheating part and the annealing part was 50 mm. The heater was formed of a tubular heat-generating body of a metal, alloy, or ceramic material. The opposite ends of each container 30 were fixed by fixing spindles.

As above mentioned, twenty containers 30 were fixed at given locations, and thereafter the temperature was raised at a heating rate of 50° C./hour under normal pressure with use of the heaters. The position of the melt-producing part was aligned to the upper end of the seed crystal 18 and held at 1050° C. Moreover the temperature of the pre-heating part and that of the annealing part were held at 800° C. The temperature gradient between the preheating part and the melt-producing part and that between the annealing part and the melt-producing part was 75° C./cm for each. Holding the above condition, the heaters were simultaneously moved at 30 mm/day, while the temperature of the melt-producing part was decreased down to 950° C. at 100° C./day. When its temperature reached 950° C. in 24 hours, the melt-producing part was held at the same temperature, and each heater was continuously moved for 9 days. After growing a single crystal, the melt-producing part was decreased down at 50° C./hour, and twenty sealing members were removed.

Each crucible was taken out of the corresponding sealing member thus removed, and the grown crystals were cut out each in a thickness of 3.5 mm, starting from a point above the seed crystal 18 to obtain 70 samples. The totally 1400 grown samples were obtained from the totally 20 crucibles, and the composition and the optical characteristics, i.e., the Faraday rotation angle and the cut-off wavelength of light absorption were investigated with respect to them. Results obtained are listed in Tables 1 and 2.

TABLE 1

| Crucible No. | Position of sample | Composition Hg | Cd | Mn | Te | Faraday rotation (deg/cm Oe) | Cut-off wavelength (nm) | Practically usable or not |
|---|---|---|---|---|---|---|---|---|
| 1 | 1 | 0.00 | 1.00 | 0.00 | 1.0 | | | x |
| | 3 | 0.08 | 0.74 | 0.18 | 1.0 | 0.042 | 880 | x |
| | 5 | 0.10 | 0.73 | 0.17 | 1.0 | 0.045 | 890 | x |
| | 7 | 0.12 | 0.71 | 0.17 | 1.0 | 0.048 | 900 | x |
| | 9 | 0.14 | 0.70 | 0.16 | 1.0 | 0.056 | 920 | Δ |
| | 10 | 0.15 | 0.69 | 0.16 | 1.0 | 0.058 | 930 | Δ |
| | 11 | 0.16 | 0.68 | 0.16 | 1.0 | 0.060 | 940 | ○ |
| | 12 | 0.16 | 0.68 | 0.16 | 1.0 | 0.060 | 940 | ○ |
| | 13 | 0.16 | 0.68 | 0.16 | 1.0 | 0.060 | 940 | ○ |
| | 15 | 0.16 | 0.68 | 0.16 | 1.0 | 0.060 | 940 | ○ |
| | 20 | 0.16 | 0.68 | 0.16 | 1.0 | 0.060 | 940 | ○ |
| | 25 | 0.16 | 0.68 | 0.16 | 1.0 | 0.060 | 940 | ○ |
| | 30 | 0.16 | 0.68 | 0.16 | 1.0 | 0.060 | 940 | ○ |
| | 35 | 0.16 | 0.68 | 0.16 | 1.0 | 0.060 | 940 | ○ |
| | 40 | 0.16 | 0.68 | 0.16 | 1.0 | 0.060 | 940 | ○ |
| | 45 | 0.16 | 0.68 | 0.16 | 1.0 | 0.060 | 940 | ○ |
| | 50 | 0.16 | 0.68 | 0.16 | 1.0 | 0.060 | 940 | ○ |
| | 55 | 0.16 | 0.68 | 0.16 | 1.0 | 0.060 | 940 | ○ |
| | 60 | 0.16 | 0.68 | 0.16 | 1.0 | 0.060 | 940 | ○ |
| | 63 | 0.16 | 0.68 | 0.16 | 1.0 | 0.060 | 940 | ○ |
| | 64 | 0.16 | 0.68 | 0.16 | 1.0 | 0.060 | 940 | ○ |
| | 65 | 0.16 | 0.68 | 0.16 | 1.0 | 0.060 | 940 | ○ |
| | 66 | 0.25 | 0.61 | 0.14 | 1.0 | measurement impossible | | x |
| | 67 | 0.48 | 0.42 | 0.10 | 1.0 | measurement impossible | | x |
| | 68 | 0.30 | 0.57 | 0.13 | 1.0 | measurement impossible | | x |
| | 69 | 0.16 | 0.68 | 0.16 | 1.0 | polycrystal | | x |
| | 70 | 0.16 | 0.68 | 0.16 | 1.0 | polycrystal | | x |

TABLE 2

| Crucible No. | Position of sample | Composition Hg | Cd | Mn | Te | Faraday rotation (deg/cm Oe) | Cut-off wavelength (nm) | Practically usable or not |
|---|---|---|---|---|---|---|---|---|
| 2 | 10 | 0.15 | 0.69 | 0.16 | 1.0 | 0.058 | 930 | x |
| | 11 | 0.16 | 0.68 | 0.16 | 1.0 | 0.060 | 940 | ○ |
| | 20 | 0.16 | 0.68 | 0.16 | 1.0 | 0.060 | 940 | ○ |
| | 30 | 0.16 | 0.68 | 0.16 | 1.0 | 0.060 | 940 | ○ |
| | 40 | 0.16 | 0.68 | 0.16 | 1.0 | 0.060 | 940 | ○ |
| | 50 | 0.16 | 0.68 | 0.16 | 1.0 | 0.060 | 940 | ○ |
| | 60 | 0.16 | 0.68 | 0.16 | 1.0 | 0.060 | 940 | ○ |
| | 65 | 0.16 | 0.68 | 0.16 | 1.0 | 0.060 | 940 | ○ |
| | 66 | 0.25 | 0.61 | 0.14 | 1.0 | measurement impossible | | x |
| 3 | 40 | 0.16 | 0.68 | 0.16 | 1.0 | 0.060 | 940 | ○ |
| 4 | 40 | 0.16 | 0.68 | 0.16 | 1.0 | 0.060 | 940 | ○ |
| 5 | 40 | 0.16 | 0.68 | 0.16 | 1.0 | 0.060 | 940 | ○ |
| 6 | 40 | 0.16 | 0.68 | 0.16 | 1.0 | 0.060 | 940 | ○ |
| 7 | 40 | 0.16 | 0.68 | 0.16 | 1.0 | 0.060 | 940 | ○ |
| 8 | 40 | 0.16 | 0.68 | 0.16 | 1.0 | 0.060 | 940 | ○ |
| 9 | 40 | 0.16 | 0.68 | 0.16 | 1.0 | 0.060 | 940 | ○ |
| 10 | 40 | 0.16 | 0.68 | 0.16 | 1.0 | 0.060 | 940 | ○ |
| 11 | 40 | 0.16 | 0.68 | 0.16 | 1.0 | 0.060 | 940 | ○ |
| 12 | 40 | 0.16 | 0.68 | 0.16 | 1.0 | 0.060 | 940 | ○ |
| 13 | 40 | 0.16 | 0.68 | 0.16 | 1.0 | 0.060 | 940 | ○ |
| 14 | 40 | 0.16 | 0.68 | 0.16 | 1.0 | 0.060 | 940 | ○ |
| 15 | 40 | 0.16 | 0.68 | 0.16 | 1.0 | 0.060 | 940 | ○ |
| 16 | 40 | 0.16 | 0.68 | 0.16 | 1.0 | 0.060 | 940 | ○ |
| 17 | 40 | 0.16 | 0.68 | 0.16 | 1.0 | 0.060 | 940 | ○ |
| 18 | 40 | 0.16 | 0.68 | 0.16 | 1.0 | 0.060 | 940 | ○ |
| 19 | 40 | 0.16 | 0.68 | 0.16 | 1.0 | 0.060 | 940 | ○ |
| 20 | 40 | 0.16 | 0.68 | 0.16 | 1.0 | 0.060 | 940 | ○ |

In Table 1, the results are given on No. 1 among the twenty crucibles. The wording "Position of sample" means the position of each sample in a case where samples were cut out successively upwardly in order starting from above the seed crystal 18. The smaller the number of the position of the sample, the nearer the position to the seed crystal 18, whereas the larger the number of the position of the sample, the farther the position of the sample to the seed crystal.

Apparent from the above, in one grown crystal, ten of the samples were in the lower part of the crucible in the composition-changing area, and five of the samples were in the upper part thereof, in an area of the melt, so that they cannot be employed as optical isolator elements at a wavelength of 980 nm. Moreover as shown in Tables 1 and 2, the midst fifty five samples have a uniform composition for each of all twenty grown crystals. Accordingly it is confirmed that 1100 single crystal samples having the uniform composition could be obtained at the same time.

Comparative Example A

A single crystal was grown by a conventional THM method. As a sealing member also functioning as a crucible, a container made of quartz glass having an inner diameter of 15 mm, a length of 100 mm, and a thickness of 3 mm was employed. About seven five grams of the starting material was put into the container, and the sealing member was sealed in vacuum. A 20 mm-long lower part of the container was formed in a tapered shape, and a seed crystal having the diameter of 3 mm and the length of 30 mm was placed under the tapered part, and the starting material was melted and a single crystal was grown as in Example A. The single crystal was grown under a pressure of 30 atms in an Ar gas by using a THM growing furnace having a pressurizing container with a pressure-resistance of 100 atms. The heating mechanism employed had a melt-producing part with an inner of 30 mm and a length of 20 mm, an annealing part and a pre-heating part each having an inner diameter of 30 mm and a length of 50 mm. The growing speed of the single crystal was 4 mm/day, and 20 days were needed for the growth.

Consequently, a single crystal was fonned with a diameter of 15 mm and a length of 60 mm. The single crystal was transversely cut to obtain 15 wafers having a thickness of 3.5 mm and a diameter of 15 mm. Their characteristics were measured as in Example A, and results are listed in Tables 3 and 4.

TABLE 3

| Wafer No. | Position of sample | Composition | | | | Faraday rotation (deg/cm Oe) | Cut-off wavelength (nm) | Practically usable or not |
|---|---|---|---|---|---|---|---|---|
| | | Hg | Cd | Mn | Te | | | |
| 1 | a | 0.10 | 0.73 | 0.17 | 1.0 | 0.045 | 890 | x |
| | b | 0.10 | 0.73 | 0.17 | 1.0 | 0.045 | 890 | x |
| | c | 0.09 | 0.73 | 0.18 | 1.0 | 0.043 | 885 | x |
| | d | 0.08 | 0.74 | 0.18 | 1.0 | 0.042 | 880 | x |
| | e | 0.08 | 0.74 | 0.18 | 1.0 | 0.042 | 880 | x |
| 3 | a | 0.12 | 0.71 | 0.17 | 1.0 | 0.048 | 900 | x |
| | b | 0.12 | 0.71 | 0.17 | 1.0 | 0.048 | 900 | x |
| | c | 0.11 | 0.72 | 0.17 | 1.0 | 0.047 | 895 | x |
| | d | 0.10 | 0.73 | 0.17 | 1.0 | 0.045 | 890 | x |
| | e | 0.10 | 0.73 | 0.17 | 1.0 | 0.045 | 890 | x |
| 5 | a | 0.14 | 0.70 | 0.16 | 1.0 | 0.056 | 920 | Δ |
| | b | 0.14 | 0.70 | 0.16 | 1.0 | 0.056 | 920 | Δ |
| | c | 0.13 | 0.70 | 0.17 | 1.0 | 0.052 | 910 | x |
| | d | 0.12 | 0.71 | 0.17 | 1.0 | 0.048 | 900 | x |
| | e | 0.12 | 0.71 | 0.17 | 1.0 | 0.048 | 900 | x |
| 6 | a | 0.16 | 0.68 | 0.16 | 1.0 | 0.060 | 940 | ○ |
| | b | 0.16 | 0.68 | 0.16 | 1.0 | 0.060 | 940 | ○ |
| | c | 0.15 | 0.69 | 0.16 | 1.0 | 0.058 | 930 | Δ |
| | d | 0.14 | 0.70 | 0.16 | 1.0 | 0.056 | 920 | Δ |
| | e | 0.13 | 0.70 | 0.17 | 1.0 | 0.052 | 910 | x |
| 8 | a | 0.16 | 0.68 | 0.16 | 1.0 | 0.060 | 940 | ○ |
| | b | 0.16 | 0.68 | 0.16 | 1.0 | 0.060 | 940 | ○ |
| | c | 0.15 | 0.69 | 0.16 | 1.0 | 0.058 | 930 | Δ |
| | d | 0.14 | 0.70 | 0.16 | 1.0 | 0.056 | 920 | Δ |
| | e | 0.13 | 0.70 | 0.17 | 1.0 | 0.052 | 910 | x |

TABLE 4

| Wafer No. | Position of sample | Composition | | | | Faraday rotation (deg/cm Oe) | Cut-off wavelength (nm) | Practically usable or not |
|---|---|---|---|---|---|---|---|---|
| | | Hg | Cd | Mn | Te | | | |
| 10 | a | 0.16 | 0.68 | 0.16 | 1.0 | 0.060 | 940 | ○ |
| | b | 0.16 | 0.68 | 0.16 | 1.0 | 0.060 | 940 | ○ |
| | c | 0.15 | 0.69 | 0.16 | 1.0 | 0.058 | 930 | Δ |
| | d | 0.14 | 0.70 | 0.16 | 1.0 | 0.056 | 920 | Δ |

TABLE 4-continued

| Wafer No. | Position of sample | Composition Hg | Cd | Mn | Te | Faraday rotation (deg/cm Oe) | Cut-off wavelength (nm) | Practically usable or not |
|---|---|---|---|---|---|---|---|---|
|  | e | 0.13 | 0.70 | 0.17 | 1.0 | 0.052 | 910 | x |
| 11 | a | 0.19 | 0.66 | 0.15 | 1.0 | 0.060 | 970 | x |
|  | b | 0.18 | 0.67 | 0.15 | 1.0 | 0.060 | 960 | x |
|  | c | 0.18 | 0.67 | 0.15 | 1.0 | 0.061 | 960 | x |
|  | d | 0.17 | 0.67 | 0.16 | 1.0 | 0.062 | 950 | x |
|  | e | 0.17 | 0.67 | 0.16 | 1.0 | 0.062 | 950 | x |
| 13 | a | 0.30 | 0.57 | 0.13 | 1.0 | measurement impossible |  | x |
|  | b | 0.30 | 0.57 | 0.13 | 1.0 | measurement impossible |  | x |
|  | c | 0.30 | 0.57 | 0.13 | 1.0 | measurement impossible |  | x |
|  | d | 0.30 | 0.57 | 0.13 | 1.0 | measurement impossible |  | x |
|  | e | 0.30 | 0.57 | 0.13 | 1.0 | measurement impossible |  | x |
| 15 | a | 0.48 | 0.42 | 0.10 | 1.0 | measurement impossible |  | x |
|  | b | 0.48 | 0.42 | 0.10 | 1.0 | measurement impossible |  | x |
|  | c | 0.48 | 0.42 | 0.10 | 1.0 | measurement impossible |  | x |
|  | d | 0.48 | 0.42 | 0.10 | 1.0 | measurement impossible |  | x |
|  | e | 0.48 | 0.42 | 0.10 | 1.0 | measurement impossible |  | x |

In Tables 3 and 4, the wafer number denotes the first, second, third, through fifteenth wafer from the bottom of the sample. The position of the sample denoted the each position as shown in FIG. 5(a). It is realized that the area of a desired composition is around thickness 7 mm and length 25 mm near the center of the wafer. That is, in this growing method, only 30 elements of a desired composition having a diameter of 2 mm and a length of 3.5 mm were obtained.

EXAMPLE B

A growing experiment was carried out as in Example A. However the thickness of the quartz glass was 3 mm, the inner diameter and the length of the crucible 16b were 6 mm and 200 mm respectively, the inner diameter and the length of the enlarged part were 10 mm and 50 mm respectively. A crucible made of graphite coated with pyrolytic carbon thin film in its inner (total thickness with 2 mm) was employed as the crucible 16. 30 g of the powdery sources was put into the crucible 16. The number of containers was ten. The inner diameter and the length of the melt producing part were 18 mm and 15 mm, respectively, and the length of the pre-heating part and annealing part was 50 mm.

The ten containers 30 were fixed at given places, thereafter the thermal treating equipment was heated at 50° C./hour under normal pressure. The position of the melt producing part was prepared equivalent to the upper end of the original crystal 18 and the melt producing part was held at 1050° C. The temperature of the pre-heating part and the annealing part was held at 800° C. This time, the temperature gradients of between the pre-heating part and the melt producing part and between the annealing part and the melt producing part were 65° C./cm respectively. Holding the above conditions, each of the thermal treating equipment was moved at 10 mm/day at the same time and the temperature of the melt producing part was fell down to 950° C. at 50° C./day. When its temperature was 950° C. at 48 hours later, by holding the temperature each thermal treating equipment was continued to be moved for 15 days. After growing, the melt producing part was cooled at 50° C./hour and the ten sealed members were taken out.

Each crucible was taken out of each sealed member and forty wafers were cut with thickness 3.5 mm and diameter 6 mm of the seed crystal 18 in turn from the upper part thereof. Four samples were formed with a diameter of 2.5 mm of each wafer to obtain 160 samples. Accordingly 1600 samples were totally formed of ten grown crystals. Their composition, Faraday rotation angle and cut off wavelength of light absorption were investigated. The results were listed in Tables 5 and 6.

TABLE 5

| Crucible No. | Position of sample | Composition Hg | Cd | Mn | Te | Faraday rotation (deg/cm Oe) | Cut-off wavelength (nm) | Practically usable or not |
|---|---|---|---|---|---|---|---|---|
| 1 | 1 | 0.00 | 1.00 | 0.00 | 1.0 | measurement impossible |  | x |
|  | 3 | 0.08 | 0.74 | 0.18 | 1.0 | 0.042 | 880 | x |
|  | 5 | 0.10 | 0.73 | 0.17 | 1.0 | 0.045 | 890 | x |

TABLE 5-continued

| Crucible No. | Position of sample | Composition Hg | Cd | Mn | Te | Faraday rotation (deg/cm Oe) | Cut-off wavelength (nm) | Practically usable or not |
|---|---|---|---|---|---|---|---|---|
| | 7 | 0.12 | 0.71 | 0.17 | 1.0 | 0.048 | 900 | x |
| | 9 | 0.14 | 0.70 | 0.16 | 1.0 | 0.056 | 920 | Δ |
| | 10 | 0.15 | 0.69 | 0.16 | 1.0 | 0.058 | 930 | Δ |
| | 11 | 0.16 | 0.68 | 0.16 | 1.0 | 0.060 | 940 | ○ |
| | 12 | 0.16 | 0.68 | 0.16 | 1.0 | 0.060 | 940 | ○ |
| | 13 | 0.16 | 0.68 | 0.16 | 1.0 | 0.060 | 940 | ○ |
| | 15 | 0.16 | 0.68 | 0.16 | 1.0 | 0.060 | 940 | ○ |
| | 20-1 | 0.16 | 0.68 | 0.16 | 1.0 | 0.060 | 940 | ○ |
| | 20-2 | 0.16 | 0.68 | 0.16 | 1.0 | 0.060 | 940 | ○ |
| | 20-3 | 0.16 | 0.68 | 0.16 | 1.0 | 0.060 | 940 | ○ |
| | 20-4 | 0.16 | 0.68 | 0.16 | 1.0 | 0.060 | 940 | ○ |
| | 25 | 0.16 | 0.68 | 0.16 | 1.0 | 0.060 | 940 | ○ |
| | 30 | 0.16 | 0.68 | 0.16 | 1.0 | 0.060 | 940 | ○ |
| | 33 | 0.16 | 0.68 | 0.16 | 1.0 | 0.060 | 940 | ○ |
| | 34 | 0.16 | 0.68 | 0.16 | 1.0 | 0.060 | 940 | ○ |
| | 35 | 0.16 | 0.68 | 0.16 | 1.0 | 0.060 | 940 | ○ |
| | 36 | 0.25 | 0.61 | 0.14 | 1.0 | measurement impossible | | x |
| | 37 | 0.48 | 0.42 | 0.10 | 1.0 | measurement impossible | | x |
| | 38 | 0.30 | 0.57 | 0.13 | 1.0 | measurement impossible | | x |
| | 39 | 0.16 | 0.68 | 0.16 | 1.0 | polycrystal | | x |
| | 40 | 0.16 | 0.68 | 0.16 | 1.0 | polycrystal | | x |

TABLE 6

| Crucible No. | Position of sample | Composition Hg | Cd | Mn | Te | Faraday rotation (deg/cm Oe) | Cut-off wavelength (nm) | Practically usable or not |
|---|---|---|---|---|---|---|---|---|
| 2 | 10 | 0.15 | 0.69 | 0.16 | 1.0 | 0.058 | 930 | x |
| | 11 | 0.16 | 0.68 | 0.16 | 1.0 | 0.060 | 940 | ○ |
| | 20 | 0.16 | 0.68 | 0.16 | 1.0 | 0.060 | 940 | ○ |
| | 30 | 0.16 | 0.68 | 0.16 | 1.0 | 0.060 | 940 | ○ |
| | 35 | 0.16 | 0.68 | 0.16 | 1.0 | 0.060 | 940 | ○ |
| | 36 | 0.25 | 0.61 | 0.14 | 1.0 | measurement impossible | | x |
| 3 | 20 | 0.16 | 0.68 | 0.16 | 1.0 | 0.060 | 940 | ○ |
| 4 | 20 | 0.16 | 0.68 | 0.16 | 1.0 | 0.060 | 940 | ○ |
| 5 | 20 | 0.16 | 0.68 | 0.16 | 1.0 | 0.060 | 940 | ○ |
| 6 | 20 | 0.16 | 0.68 | 0.16 | 1.0 | 0.060 | 940 | ○ |
| 7 | 20 | 0.16 | 0.68 | 0.16 | 1.0 | 0.060 | 940 | ○ |
| 8 | 20 | 0.16 | 0.68 | 0.16 | 1.0 | 0.060 | 940 | ○ |
| 9 | 20 | 0.16 | 0.68 | 0.16 | 1.0 | 0.060 | 940 | ○ |
| 10 | 20 | 0.16 | 0.68 | 0.16 | 1.0 | 0.060 | 940 | ○ |

In Table 5, the results of the crucible with numerical number one were presented. The wording "the position of the wafer" means the cut off position of each wafer when cutting out the wafer upward from the seed crystal 18 in turn. If the number of the position of the wafer is small, the position of the cut off wafer is nearby the seed crystal. If the number is large, the position is far from the seed crystal. Since the positions of cut out samples of the each wafer were symmetric each other, only one sample per one wafer was examined in principle. In this point, the wording "[20-1]~[20-4]" denotes the four samples in the wafer 20.

Figure 6:
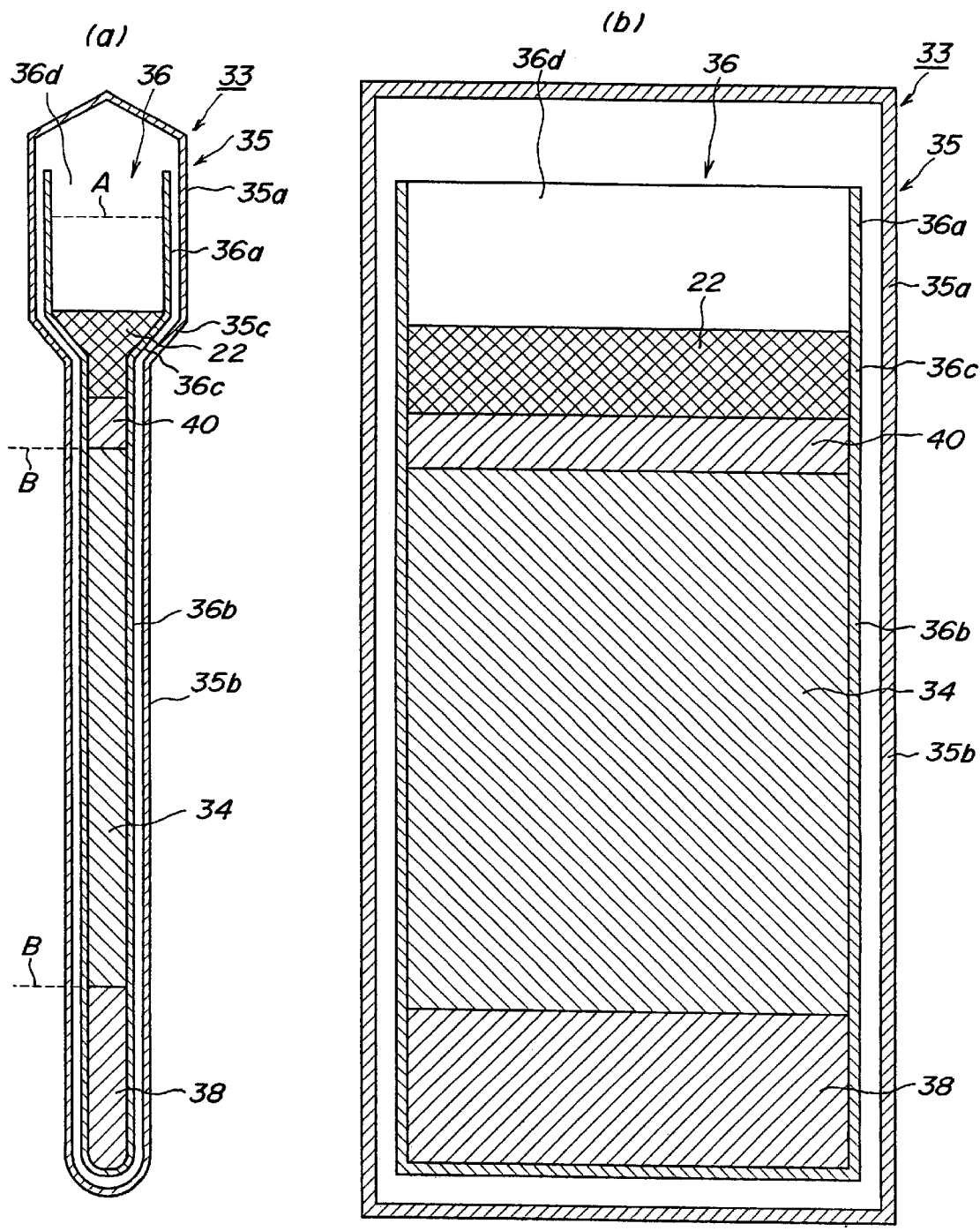
FIG. 6(a) is a longitudinal cross sectional view showing that a single crystal and a polycrystal are generated in a crucible in a seal up-member.
FIG. 6(b) is a longitudinal cross sectional view showing a seal up-member and a crucible taken on normal direction to FIG. 6(a)

In realizing the above-mentioned, since in one growing crystal, the ten lower part's samples were the changing area of their composition and the five upper part's samples were the melted area, they could not be employed as an optical isolator with 980 nm. Moreover as shown in FIGS. 5 and 6, the 100 midst samples have uniform composition in the every ten crystals. Thus it is confirmed that 1000 samples having uniform composition are obtained at the same time.

Comparative Example B

A single crystal was grown as in the Comparative Example A. As a crucible and a sealing member, a container made of quartz glass having an inner diameter of 10 mm, length of 200 mm, and thickness of 3 mm was employed. The sources weighing 75 g were put into the container and sealed in vacuum. The lower 20 mm of the container was formed in tapered shape and an seed crystal having a diameter of 3 mm and length of 30 mm was prepared under the tapered part, thereafter the sources were melted to grow a single crystal as in Example A. The single crystal was grown under the 30 atm of Ar gas by using a THM growing furnace having a pressurizing container with pressure-resistance of 100 atm. The employed heating system has a melt producing part having an inner diameter of 20 mm and a length of 15 mm, an annealing part and a pre-heating part having an inner diameter of 30 mm and a length of 50 mm respectively. The single crystal was grown for 20 days at a growing velocity of 7 mm/day.

Accordingly the single crystal was formed with a diameter of 10 mm and a length of 140 mm. The single crystal was cut off in the transverse direction thereof to obtain 35 wafers having a thickness of 3.5 mm and a diameter of 10 mm. The measured results as in the Example A were listed in Tables 7 and 8.

EXAMPLE C

This invention is adaptable for manufacturing a plate like-or a board like-single crystal. In this case, a container to grow a single crystal is required to have a shape like a board. In particular, the container has a crucible and a sealing member to accommodate the crucible, and the crucible has a board-like part extending upward and downward thereof and an enlarged part formed above the board-like part.

The thus obtained plate-like or board-like single crystals can be utilized for the mass-production of Faraday elements with polarizer elements. That is, a number of chips can be produced by using such plate-like or board-like single

TABLE 7

| Wafer No. | Position of sample | Composition | | | | Faraday rotation (deg/cm Oe) | Cut-off wavelength (nm) | Practically usable or not |
| --- | --- | --- | --- | --- | --- | --- | --- | --- |
| | | Hg | Cd | Mn | Te | | | |
| 1 | a | 0.10 | 0.73 | 0.17 | 1.0 | 0.045 | 890 | x |
| | b | 0.08 | 0.74 | 0.18 | 1.0 | 0.042 | 880 | x |
| 3 | a | 0.12 | 0.71 | 0.17 | 1.0 | 0.048 | 900 | x |
| | b | 0.10 | 0.73 | 0.17 | 1.0 | 0.045 | 890 | x |
| 5 | a | 0.13 | 0.70 | 0.17 | 1.0 | 0.052 | 910 | x |
| | b | 0.10 | 0.73 | 0.17 | 1.0 | 0.045 | 890 | x |
| 7 | a | 0.14 | 0.70 | 0.16 | 1.0 | 0.056 | 920 | Δ |
| | b | 0.12 | 0.71 | 0.17 | 1.0 | 0.048 | 900 | x |
| 9 | a | 0.15 | 0.69 | 0.16 | 1.0 | 0.058 | 930 | Δ |
| | b | 0.12 | 0.71 | 0.17 | 1.0 | 0.048 | 900 | x |
| 10 | a | 0.16 | 0.68 | 0.16 | 1.0 | 0.060 | 940 | ○ |
| | b | 0.13 | 0.70 | 0.17 | 1.0 | 0.052 | 910 | x |
| 15 | a | 0.16 | 0.68 | 0.16 | 1.0 | 0.060 | 940 | ○ |
| | b | 0.13 | 0.70 | 0.17 | 1.0 | 0.052 | 910 | x |
| 20 | a | 0.16 | 0.68 | 0.16 | 1.0 | 0.060 | 940 | ○ |
| | b | 0.13 | 0.70 | 0.17 | 1.0 | 0.052 | 910 | x |

TABLE 8

| Wafer No. | Position of sample | Composition | | | | Faraday rotation (deg/cm Oe) | Cut-off wavelength (nm) | Practically usable or not |
| --- | --- | --- | --- | --- | --- | --- | --- | --- |
| | | Hg | Cd | Mn | Te | | | |
| 25 | a | 0.16 | 0.68 | 0.16 | 1.0 | 0.060 | 940 | ○ |
| | b | 0.13 | 0.70 | 0.17 | 1.0 | 0.052 | 910 | x |
| 29 | a | 0.16 | 0.68 | 0.16 | 1.0 | 0.060 | 940 | ○ |
| | b | 0.13 | 0.70 | 0.17 | 1.0 | 0.052 | 910 | x |
| 30 | a | 0.17 | 0.67 | 0.16 | 1.0 | 0.062 | 950 | x |
| | b | 0.14 | 0.70 | 0.16 | 1.0 | 0.056 | 920 | Δ |
| 31 | a | 0.19 | 0.66 | 0.15 | 1.0 | 0.060 | 970 | x |
| | b | 0.17 | 0.67 | 0.16 | 1.0 | 0.062 | 950 | x |
| 33 | a | 0.30 | 0.57 | 0.13 | 1.0 | measurement impossible | | x |
| | b | 0.30 | 0.57 | 0.13 | 1.0 | measurement impossible | | x |
| 35 | a | 0.48 | 0.57 | 0.13 | 1.0 | measurement impossible | | x |
| | b | 0.48 | 0.42 | 0.10 | 1.0 | measurement impossible | | x |

In Tables 7 and 8, the wafer number denotes the first, second, third, through thirtieth wafer from the bottom of the sample. The position of the sample denoted the each position as shown in FIG. 5(b). It is realized that the area of a desired composition is around a thickness of 6 mm and a length of 80 mm near the center of the wafer. That is, in this growing method, only 80 elements of a desired composition having a diameter of 2.5 mm and a length of 3.5 mm were obtained.

crystals as Faraday elements, bonding plate-like polarizers such as of rutile or polar cor to surfaces of the Faraday elements to obtain joined bodies, and cutting and grinding the joined bodies and finally cut the cut pieces.

Referring to FIGS. 6(a) and (b), a further preferred embodiment will be described, wherein in FIGS. 6(a) and 6(b) the same reference numerals are given to the same constituent parts as in FIGS. 4(a) and 4(b), and their explanation is omitted. A container 33 includes a crucible 36 and a sealing member 35 to seal the container. The crucible 36 includes an enlarged part 3a, a plate-like part 36b, and a connecting part 36c between them. The sealing member 35 includes an enlarged part 35a, a plate-like part 35b, and a connecting part 35c between them. The reference numeral 36d denotes an opening of the crucible 36.

From the viewpoint of making the composition of an obtained single crystal more uniform, the thickness of the inner space of the plate like-part of the crucible is preferably 5 mm or less, more preferably 3 mm or less. Although the lower limit of thickness is not particularly limited, it is required to be at least not less than the thickness of a final product. From the viewpoint of making the handling of the single crystal easy, it is preferably 2 mm or more. Although the width of the inner space of the plate ike part of the crucible is not limited, it may be set to be 10 to 80 mm, for example.

According to the above-mentioned method explained in referring to FIG. 1 to FIG. 4, a single crystal having a composition of Hg—Cd—Mn—Te was grown as an optical material by using the container shown in FIGS. 6(a) and (b). Cd, Mn, an Hg—Te and Cd—Te were employed as a powdery starting material 17. A plate-like Cd—Te crystal having a (111) crystalline orientation (thickness: 4 mm, width: 15 mm, length: 30 mm) was used as a seed crystal. The starting material, 400 g, was formulated to give a formulated composition of $(Hg_{0.16}Cd_{0.68}Mn_{0.16})Te$. The scaling member 15 was formed of quartz glass in a thickness of 2 mm. The thickness, the width and the length of the inner space of the plate-like part 36b were 3 mm, 15 mm and 12 mm, respectively. The thickness, the width and the length of the inner space of the enlarged part 36a were 5 mm, 15 mm and 30 mm, respectively. The crucible was formed of 1 mm thick p-BN. After putting the seed crystal into the container, 40 g of the powdery starting material was charged into the crucible 36, the crucible was placed in the sealing member, and the sealing member was sealed.

Each container 33 was formed of ten sealing members to obtain a polycrystal as in Example A. Consequently, each container 33 was taken out and prepared in the manufacturing equipment of FIGS. 1 and 2. In this case, the inner space of the melt producing part in the thermal treating equipment was formed with a thickness of 15 mm, a width of 30 mm and a length of 10 mm. The length of the pre-heating part and the annealing part was 50 mm. The thermal equipment was also formed of a plate like-exothermic body made of metal, alloy or ceramic material. The ends of the each container 33 were fixed with fixing axes.

As mentioned above, ten containers 33 were fixed at given places, and the temperature was raised at 50° C./hour under normal pressure by using heaters. The position of the melt-producing part was aligned with the upper end of the seed crystal 38, and the melt-producing part was held at 1050° C. The temperature of each of the preheating part and the annealing part was held at 800° C. At this time, the temperature gradient between the preheating part and the melt-producing part and that between the annealing part and the melt-producing part were both 65° C./cm. Holding the above condition, the heaters were all simultaneously moved at 10 mm/day, while the temperature of the melt-producing part was fell down to 950° C. at 50° C./day. When its temperature reached 950° C. in 48 hours, the temperature was kept as it was, and the heaters were continuously moved for 9 days. After growing, the melt-producing part was cooled at 50° C./hour, and ten scaling members were removed.

Each crucible was taken out of the corresponding sealing member removed, and grown crystals were cut out in a length of 12 mm out starting from above the seed crystal 38 to obtain nine samples. Each sample was cut to have a vertical size of 12 mm, a lateral size of 12 mm, and polished at the opposite surfaces to give a thickness of 3.5 mm. Ninety samples were totally formed of ten crystals. The composition and optical characteristics, i.e., Faraday rotation angle and cut off wavelength in light absorption were examined with respect to them. Results are given in Tables 9 and 10.

TABLE 9

| Crucible No. | Position of sample | Composition | | | | Faraday rotation (deg/cm Oe) | Cut-off wavelength (nm) | Practically usable or not |
|---|---|---|---|---|---|---|---|---|
| | | Hg | Cd | Mn | Te | | | |
| 1 | 1a | 0.08 | 0.74 | 0.18 | 1.0 | 0.042 | 880 | x |
| | 1b | 0.10 | 0.73 | 0.17 | 1.0 | 0.045 | 890 | x |
| | 1c | 0.12 | 0.71 | 0.17 | 1.0 | 0.048 | 900 | x |
| | 2a | 0.14 | 0.70 | 0.16 | 1.0 | 0.056 | 920 | Δ |
| | 2b | 0.15 | 0.69 | 0.16 | 1.0 | 0.058 | 930 | Δ |
| | 2c | 0.16 | 0.68 | 0.16 | 1.0 | 0.060 | 940 | ○ |
| | 3a | 0.16 | 0.68 | 0.16 | 1.0 | 0.060 | 940 | ○ |
| | 3b | 0.16 | 0.68 | 0.16 | 1.0 | 0.060 | 940 | ○ |
| | 3c | 0.16 | 0.68 | 0.16 | 1.0 | 0.060 | 940 | ○ |
| | 3d | 0.16 | 0.68 | 0.16 | 1.0 | 0.060 | 940 | ○ |
| | 3e | 0.16 | 0.68 | 0.16 | 1.0 | 0.060 | 940 | ○ |
| | 3f | 0.16 | 0.68 | 0.16 | 1.0 | 0.060 | 940 | ○ |
| | 3g | 0.16 | 0.68 | 0.16 | 1.0 | 0.060 | 940 | ○ |
| | 4b | 0.16 | 0.68 | 0.16 | 1.0 | 0.060 | 940 | ○ |
| | 5b | 0.16 | 0.68 | 0.16 | 1.0 | 0.060 | 940 | ○ |
| | 6b | 0.16 | 0.68 | 0.16 | 1.0 | 0.060 | 940 | ○ |
| | 7b | 0.16 | 0.68 | 0.16 | 1.0 | 0.060 | 940 | ○ |
| | 8a | 0.16 | 0.68 | 0.16 | 1.0 | 0.060 | 940 | ○ |
| | 8b | 0.16 | 0.68 | 0.16 | 1.0 | 0.060 | 940 | ○ |
| | 8c | 0.16 | 0.68 | 0.16 | 1.0 | 0.060 | 940 | ○ |
| | 8d | 0.16 | 0.68 | 0.16 | 1.0 | 0.060 | 940 | ○ |
| | 8e | 0.16 | 0.68 | 0.16 | 1.0 | 0.060 | 940 | ○ |
| | 8f | 0.16 | 0.68 | 0.16 | 1.0 | 0.060 | 940 | ○ |

TABLE 9-continued

| Crucible No. | Position of sample | Composition | | | | Faraday rotation (deg/cm Oe) | Cut-off wavelength (nm) | Practically usable or not |
|---|---|---|---|---|---|---|---|---|
| | | Hg | Cd | Mn | Te | | | |
| | 8g | 0.16 | 0.68 | 0.16 | 1.0 | 0.060 | 940 | o |
| | 9a | 0.25 | 0.61 | 0.14 | 1.0 | measurement impossible | | x |
| | 9b | 0.48 | 0.42 | 0.10 | 1.0 | measurement impossible | | x |
| | 9c | 0.30 | 0.57 | 0.13 | 1.0 | measurement impossible | | x |

TABLE 10

| Crucible No. | Position of sample | Composition | | | | Faraday rotation (deg/cm Oe) | Cut-off wavelength (nm) | Practically usable or not |
|---|---|---|---|---|---|---|---|---|
| | | Hg | Cd | Mn | Te | | | |
| 2 | 2b | 0.15 | 0.69 | 0.16 | 1.0 | 0.058 | 930 | x |
| | 3b | 0.16 | 0.68 | 0.16 | 1.0 | 0.060 | 940 | o |
| | 4b | 0.16 | 0.68 | 0.16 | 1.0 | 0.060 | 940 | o |
| | 5b | 0.16 | 0.68 | 0.16 | 1.0 | 0.060 | 940 | o |
| | 6b | 0.16 | 0.68 | 0.16 | 1.0 | 0.060 | 940 | o |
| | 7b | 0.16 | 0.68 | 0.16 | 1.0 | 0.060 | 940 | o |
| | 8b | 0.16 | 0.68 | 0.16 | 1.0 | 0.060 | 940 | o |
| | 9b | 0.48 | 0.42 | 0.10 | 1.0 | measurement impossible | | |
| 3 | 5b | 0.16 | 0.68 | 0.16 | 1.0 | 0.060 | 940 | o |
| 4 | 5b | 0.16 | 0.68 | 0.16 | 1.0 | 0.060 | 940 | o |
| 5 | 5b | 0.16 | 0.68 | 0.16 | 1.0 | 0.060 | 940 | o |
| 6 | 5b | 0.16 | 0.68 | 0.16 | 1.0 | 0.060 | 940 | o |
| 7 | 5b | 0.16 | 0.68 | 0.16 | 1.0 | 0.060 | 940 | o |
| 8 | 5b | 0.16 | 0.68 | 0.16 | 1.0 | 0.060 | 940 | o |
| 9 | 5b | 0.16 | 0.68 | 0.16 | 1.0 | 0.060 | 940 | o |
| 10 | 5b | 0.16 | 0.68 | 0.16 | 1.0 | 0.060 | 940 | o |

Figure 7:
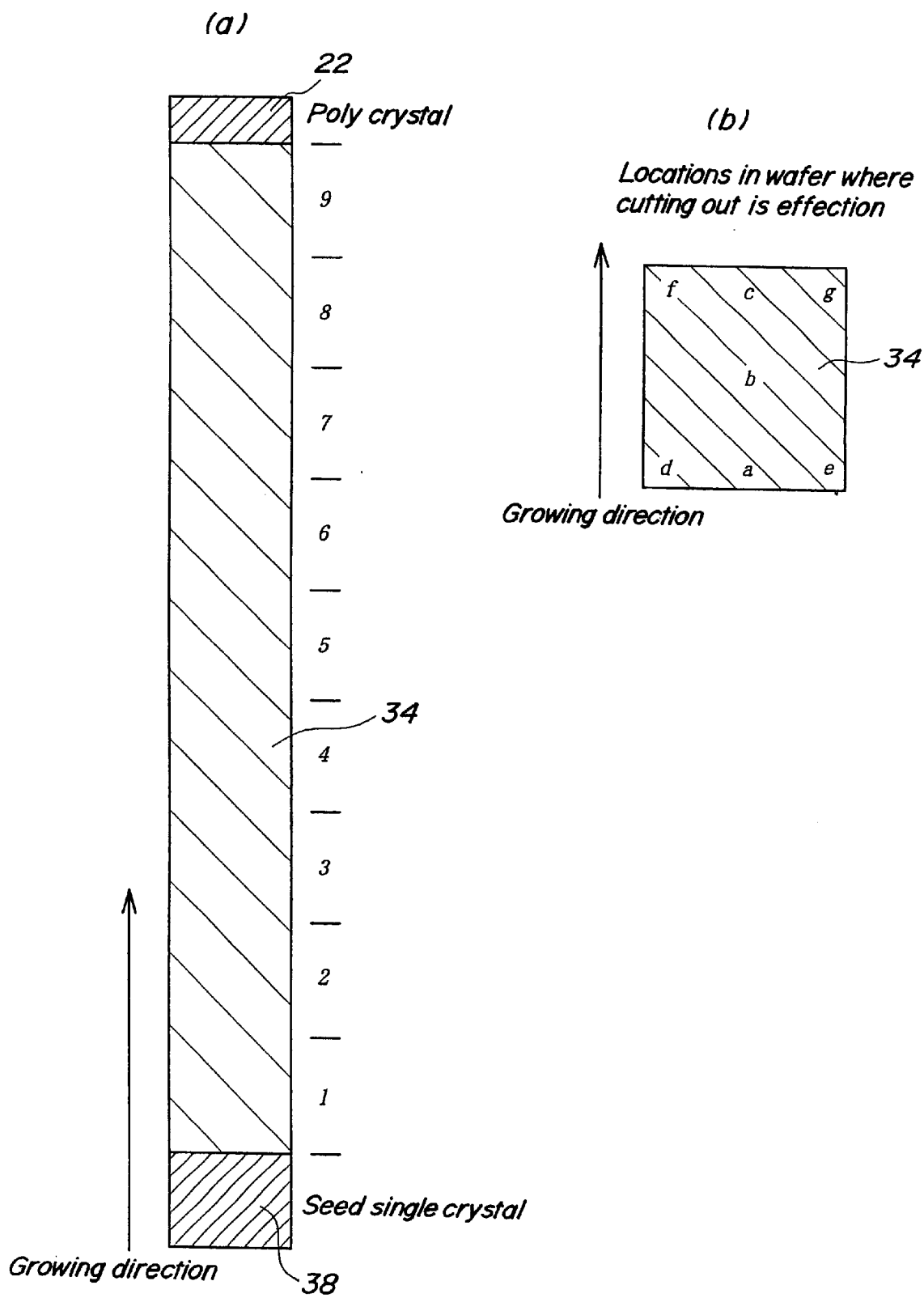
FIG. 7(a) is a cross sectional view showing a position in up and down directions in each sample cut off of a single crystal obtained in Example C.
FIG. 7(b) is a cross sectional view showing a position in transverse direction in each sample cut off of a single crystal obtained in Example C.

In Table 9 are shown results on No. 1 among ten crucibles. The wording "Position of sample" means the position of each sample in a case where samples were cut out successively upwardly in order starting from above the seed crystal 38 as shown in FIG. 7(a). The sample immediately above the seed crystal 38 is denoted by and that immediately under the polycrystal 22 is denoted by "1" , and that immediately under the polycrystal 22 is denoted by "9" . As shown in FIG. 7(b), the composition, Faraday rotation angle and cut-off wavelength in light absorption were examined with respect to each sample at points "a" to "g" . The positions "a" to "g" were shown in the sample positions.

As seen above, since in one grown crystal, the lower two samples were in a composition-changing area, and the upper one sample was in a portion 40 of the melt. As shown in Tables 9 and 10, the midst six samples had a uniform composition with respect to each of ten samples. Twenty five optical isolator elements having a vertical size of 2 mm and a lateral size of 2 mm were obtained from one usable plate-like sample after cutting.

As above mentioned, according to this invention, in the single crystal-manufacturing equipment in which the single crystal is grown by thermal treating the starting material filled in the container, the compositional segregation, the generation of different phase, and deviation in the crystal orientation in the single crystal are prevented, so that the characters of the single crystal are developed and stabilized in addition to be capable of mass-producing single crystals.

What is claimed is:

1. An equipment for producing a single crystal in each of plural containers by thermally treating a raw material for the single crystal each charged in each of the container, comprising heaters provided corresponding to each of the containers, an elevator to move each of the containers upward and downward relatively to the respective one of the heaters, and a connecting member to connect at least one of the container and the heater of each of plural sets of the containers and the heaters mechanically to the elevator, wherein each container is moved vertically relatively to the respective one of the heaters by driving the elevator and passed through an area of thermal treatment formed by the heater to continuously form a melt in the raw material inside the container, and the single crystal is continuously produced in the container by solidifying the melt.

2. The single crystal-producing equipment as claimed in claim 1, wherein each of the heaters comprises a melt-forming part to produce the melt, a preheating part formed above the melt-producing part, and an annealing part below the melt-producing part.

3. The single crystal-producing equipment as claimed in claim 1, wherein the each of the heaters has a configuration to be capable of accommodating and surrounding the respective one of the containers.

4. The single crystal-producing equipment as claimed in claim 1, wherein each of the containers comprises a crucible filled with the starting material and a scaling member to accommodate and seal the crucible.

5. The single crystal-producing equipment as claimed in claim 1, wherein the inner diameter of an area of the container to grow the single crystal is 7 mm and below.

6. The single crystal-producing equipment as claimed in claim 1, wherein each of the containers comprises a crucible filled with the starting material and a sealing member to accommodate and seal the crucible, and each of the crucibles comprises a tubular part extending upward and downward and an enlarged part at an upper side of the tubular part.

7. The single crystal-producing equipment as claimed in claim 1, wherein each of the containers comprises a crucible filled with the starting material and a sealing member to accommodate and seal the crucible, each of the crucibles comprises a tubular part extending upward and downward and an enlarged part at an upper side of the tubular part, and the interior diameter of the tubular part is 7 mm and below.

8. The single crystal-producing equipment as claimed in claim 1, wherein each of the containers comprises a crucible filled with the starting material and a sealing member to accommodate and seal the crucible, and each of the crucibles comprises a plate-like part vertically extending and an enlarged part at an upper side of the plate-like part.

9. The single crystal-producing equipment as claimed in claim 1, wherein each of the containers comprises a crucible filled with the starting material and a sealing member to accommodate and seal the crucible, each of the crucibles comprises a plate-like part vertically extending and an enlarged part at an upper side of the plate-like part, and an the thickness of an interior space of the plate-like part is 2 mm to 5 mm.

* * * * *